United States Patent
Bhakta et al.

(10) Patent No.: US 11,411,358 B2
(45) Date of Patent: *Aug. 9, 2022

(54) OUTLET CONNECTION SCHEMA FOR A PDU

(71) Applicant: Server Technology, Inc., Reno, NV (US)

(72) Inventors: Vimal Bhakta, Reno, NV (US); Nate Moll, Reno, NV (US); Jose Martinez, Reno, NV (US); Dominic Barker, Reno, NV (US)

(73) Assignee: Server Technology, Inc., Reno, NV (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/227,712

(22) Filed: Apr. 12, 2021

(65) Prior Publication Data

US 2021/0305759 A1    Sep. 30, 2021

Related U.S. Application Data

(63) Continuation of application No. 16/039,211, filed on Jul. 18, 2018, now Pat. No. 10,978,839.

(60) Provisional application No. 62/534,139, filed on Jul. 18, 2017.

(51) Int. Cl.
     *H01R 25/00*      (2006.01)
     *H02B 1/34*      (2006.01)

(52) U.S. Cl.
     CPC ............ *H01R 25/003* (2013.01); *H02B 1/34* (2013.01)

(58) Field of Classification Search
CPC ...... H01R 24/78; H01R 25/003; H01R 4/023; H01R 4/027; H05K 7/1492
See application file for complete search history.

(56) References Cited

U.S. PATENT DOCUMENTS

| 7,367,121 | B1 | 5/2008 | Goman |
| 7,955,096 | B2 | 6/2011 | Arenas et al. |
| 8,305,737 | B2 | 11/2012 | Ewing et al. |
| 8,694,272 | B2 | 4/2014 | Ewing et al. |
| 10,978,839 | B2* | 4/2021 | Bhakta ................ H01R 25/003 |
| 2005/0211460 | A1 | 9/2005 | Draggie et al. |
| 2017/0133791 | A1 | 5/2017 | Vass |

OTHER PUBLICATIONS

International Search Report and Written Opinion for International Application No. PCT/US2019/042379; dated Aug. 30, 2019; 8 pages.

* cited by examiner

*Primary Examiner* — Jean F Duverne
(74) *Attorney, Agent, or Firm* — Perkins Coie LLP

(57) ABSTRACT

A power distribution unit including an elongate housing and a power input penetrating said elongate housing. The power input can comprise a ground buss wire, a neutral buss wire and at least one line buss wire. A plurality of electrical outlets can be disposed along the housing. Each electrical outlet can comprise a receptacle and a plurality of spaced apart outlet pins protruding from the receptacle. The plurality of outlet pins can include a ground outlet pin receiving the ground buss wire, a neutral outlet pin receiving the neutral buss wire, and a line outlet pin receiving the line buss wire.

26 Claims, 11 Drawing Sheets

OUTLET CONNECTION SCHEMA FOR A PDU

CROSS-REFERENCE TO RELATED APPLICATION

This application is a continuation of U.S. application Ser. No. 16/039,211, filed Jul. 18, 2018, titled "OUTLET CONNECTION SCHEMA FOR A PDU", which claims priority to and the benefit of U.S. Provisional Application No. 62/534,139, filed Jul. 18, 2017, the disclosures of which are hereby incorporated by reference in their entirety.

TECHNICAL FIELD

The present disclosure is directed to devices, systems, and methods used in power distribution, power management, and power monitoring applications. More particularly, the present disclosure is directed to an improved outlet pin connection schema for a power distribution unit (PDU) that allow for simplified buss wiring and can be manufactured inexpensively by automating the manufacturing process. As such, the PDUs can be manufactured inexpensively so manufacturing costs can be reduced, and the PDU can be assembled, either manually or through automation, in less time relative to existing PDU designs.

BACKGROUND

Power distribution units have long been utilized to supply power to electronic equipment. A conventional power-distribution unit (PDU) is an assembly of multiple electrical "outlets" (also called "receptacles" or "outputs") that receive electrical power from a source and distribute the electrical power via the outlets to one or more separate electronic devices having respective power cords plugged into respective outlets of the PDU. In some applications, a PDU receives power from two different power inputs, commonly referred to as "dual feed" or "dual input" PDUs. Such dual inputs can provide additional power supply capability to a PDU, and/or may provide redundant sources of power for equipment that receives power from PDU outlets. PDUs can be used in any of various applications and settings such as, for example, in or on electronic equipment racks (such as RETMA racks) to provide power to network devices (e.g., servers, routers, gateways, network switches), among other applications. One or more PDUs located in a cabinet may for convenience be referred to as Cabinet Power Distribution Units (CDU').

Power distributed to small businesses or residential customers is commonly "single phase" or "dual phase" power. In a single-phase system, a single alternating current with a sinusoidal voltage is distributed through a three-line connection consisting of a single phase current sourcing conductor, a neutral return conductor and an earth ground conductor. In a split phase system, two alternating voltage phase conductors along with an earth ground are distributed through at least three lines. The two-phase voltages are separated in time by a "phase difference" of 180 degrees— that is, the sinusoidal form of the voltage on one line leads or lags the sinusoidal form of the voltage on the other line by the amount of the phase differential. The effective voltage between the first phase line and the second phase line is therefore significantly greater than the effective voltage between each of the phase lines and the neutral line. As a result, a three-line, split-phase system may provide, for example, 120 volts in a phase-to-neutral line circuit and 240 volts in a phase-to-phase line circuit.

In larger commercial and industrial applications, three phase systems may be employed. In three phase systems, each voltage cycle on each phase line is 120 degrees, or ⅓ of a period, out of phase with the voltage cycle on each of the other two-phase lines. Three phase systems are used in large commercial and industrial applications because three-phase equipment is smaller in size, weighs less, and is more efficient than single or dual phase equipment. Although three phase circuits are somewhat more complex than single or dual phase circuits, they weigh less than single phase circuitry for the same loads supported by the circuitry. Three phase circuits also can provide a wide range of voltages and can be used for single or dual phase loads.

Three-phase power is generated by circuits in either of two configurations: (i) a "delta"; or (ii) a "wye" configuration. If one end of each of the legs of a three-phase load is centrally connected at a common point, connected to a neutral return conductor, and the other ends are connected to three phase lines (one line for each phase), the configuration is called a wye or "Y" connection. If the legs of the three phase load are connected instead in series to form a closed loop, with one phase line connected to each junction of two adjacent legs, the configuration is called a delta or "A" connection.

One reason that three phase circuits are more complex than typical single-phase circuits is the need to maintain at least somewhat balanced loads among each of the three phases. One indicator of imbalance is the level of current flowing through each phase line. If the level of current flowing through a phase line is significantly different than that flowing through a different phase line, the load is considered to be unbalanced. In a wye connected system, imbalance can also be indicated by current flowing through the neutral line. Imbalance between the loads can result in damage to the three-phase system, can cause excessive wear of components in the system such as the three-phase generator, can result in increased power usage, and can be difficult and costly to correct.

For example, high capacity data centers used in computer and communications network applications commonly utilize three-phase power to provide operating power to equipment located in hundreds or thousands of equipment racks within the data center. Commonly, three-phase power is supplied to the equipment racks via a four or five-line input, providing a line for each voltage phase, an earth ground, and a neutral line for three-phase wye connections. A vertically, or horizontally, oriented power distribution unit connects to the input and distributes power from different phases to a plurality of outputs. A three-phase PDU typically provides three or more branches of outputs, one branch for each phase, or phase pair, of power provided by the three-phase plug strip. The PDU can be mounted on or adjacent to a given equipment rack in order to supply three or more branches of single, or dual, phase power (with each such branch derived from the three-phase power input) to the rack or other equipment in the vicinity.

BRIEF DESCRIPTION OF THE DRAWINGS

The improved outlet pin connection schema described herein may be better understood by referring to the following Detailed Description in conjunction with the accompanying drawings, in which like reference numerals indicate identical or functionally similar elements.

Figure 1:
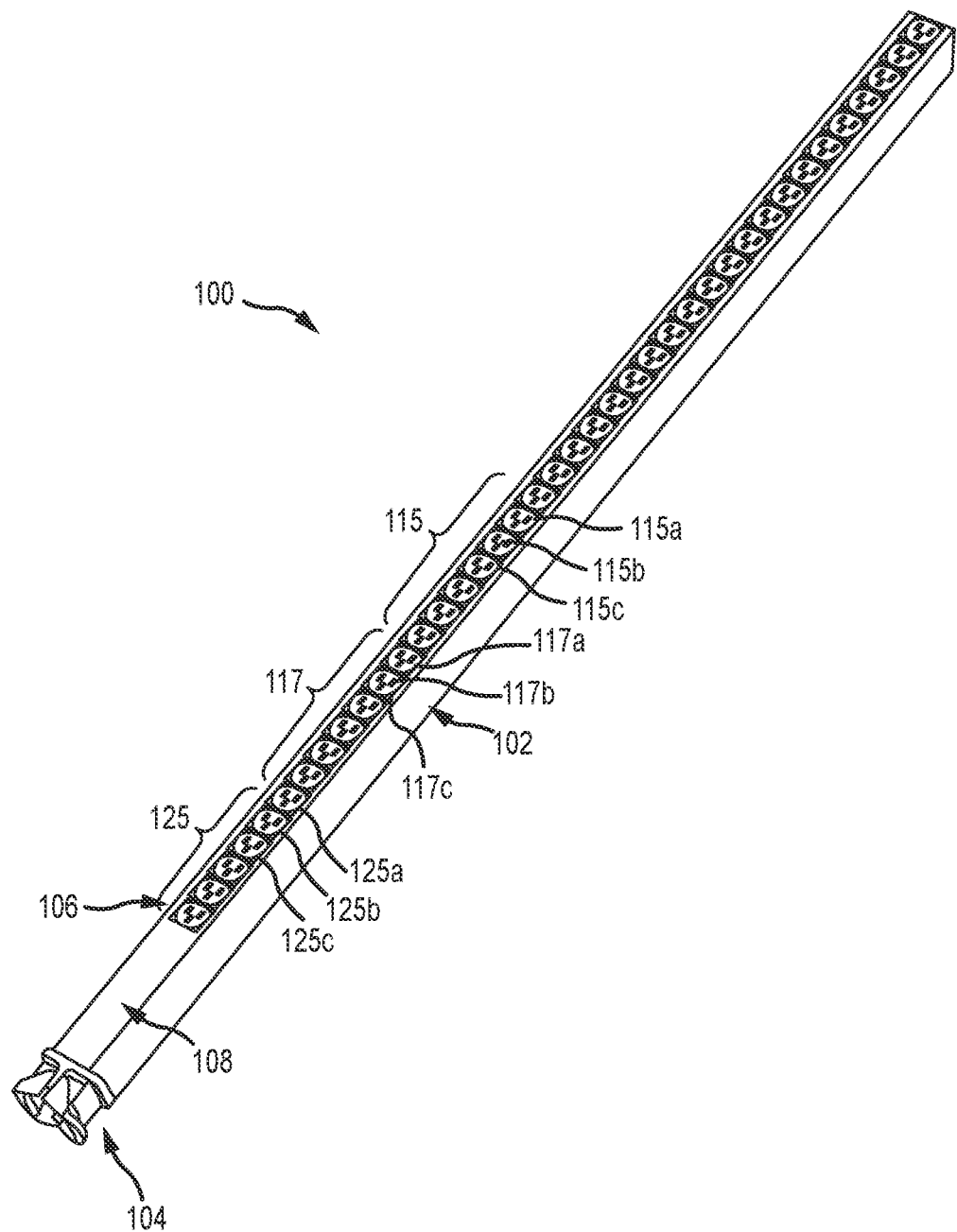
FIG. 1 is a front perspective view of a power distribution unit (PDU) of an exemplary embodiment.

The headings provided herein are for convenience only and do not necessarily affect the scope of the embodiments. Further, the drawings have not necessarily been drawn to scale. For example, the dimensions of some of the elements in the figures may be expanded or reduced to help improve the understanding of the embodiments. Moreover, while the disclosed technology is amenable to various modifications and alternative forms, specific embodiments have been shown by way of example in the drawings and are described in detail below. The intention, however, is not to unnecessarily limit the embodiments described. On the contrary, the embodiments are intended to cover all modifications, combinations, equivalents, and alternatives falling within the scope of this disclosure.

DETAILED DESCRIPTION

Various examples of the devices introduced above will now be described in further detail. The following description provides specific details for a thorough understanding and enabling description of these examples. One skilled in the relevant art will understand, however, that the techniques and technology discussed herein may be practiced without many of these details. Likewise, one skilled in the relevant art will also understand that the technology can include many other features not described in detail herein. Additionally, some well-known structures or functions may not be shown or described in detail below so as to avoid unnecessarily obscuring the relevant description.

The terminology used below is to be interpreted in its broadest reasonable manner, even though it is being used in conjunction with a detailed description of some specific examples of the embodiments. Indeed, some terms may even be emphasized below; however, any terminology intended to be interpreted in any restricted manner will be overtly and specifically defined as such in this section.

An improved outlet connection schema for a PDU is disclosed that allows for simplifying electrical connections within a PDU by utilizing multiple bus wires with the ability to wave solder these buss wires after they are installed on receptacles previously mounted to the front panel of a PDU. This provides significant gains in terms of reducing wires, improving reliability (no hand soldering), reducing manual labor overhead, and lowering costs of these PDU's.

In some embodiments, the disclosed connection schema includes offset pins that allow for different phases or different phase pairs to allow uninsulated wire to interconnect the outlets, thereby making the assembly of the PDU conducive to wave soldering.

FIG. 1 is a front perspective view of a power distribution unit (PDU) 100 of an exemplary embodiment. The PDU 100 includes an elongate housing 102 that is configured to be mounted vertically into an electronic equipment rack. As is well understood, such a vertically mountable PDU 100 may be mounted into an equipment rack at a rear portion of the equipment rack, thus consuming no vertical space in the equipment rack ("zero U") that would otherwise be used for computing equipment. The PDU 100 location at the back of the equipment rack allows power cords extending from the rear of the computing equipment to be conveniently plugged into the PDU 100. While a vertically mountable PDU 100 is illustrated in FIG. 1, the concepts and features described herein may be incorporated into power distribution devices having other form factors, such as horizontally mountable power distribution units, and power distribution devices for use in other applications. Accordingly, the particular devices and applications discussed herein are for representative purposes only.

A power input 104 penetrates the PDU housing 102 and may receive power input from multiple power phases, such as a three-phase power input. In other embodiments, power distribution units may include separate power inputs that each receive power from a different power source or power phase. In some embodiments, a single phase can be connected to two or more circuit breakers for distributing a single-phase supply into multiple outlets, creating an alternating branch outlet configuration. The PDU 100 includes, for example, three groups, or banks, of power outlets 115, 117, 125, on its front face 108. Each group of power outlets 115, 117, 125, includes a number of individual power outlets such as power outlets 115-*a*, 115-*b*, and 115-*c* of power outlet group 115, power outlets 117-*a*, 117-*b*, and 117-*c* of power outlet group 117, and power outlets 125-*a*, 125-*b*, and 125-*c* of power outlet group 125. Individual power outlets 115-*a*, 115-*b*, and 115-*c*, are located adjacent to each other and, in this embodiment, are each interconnected to a different phase of the three-phase power from power input 104. Similarly, power outlets 117-*a*, 117-*b*, 117-*c*, and 125-*a*, 125-*b*, 125-*c*, are located adjacent to each other and are each interconnected to a different phase of the three-phase power from power input 104. Thus, adjacent outlets within a group of outlets 115, 117, 125, are connected to different phases of input power, thereby providing the capability to have components within an equipment rack that are directly located above or below one another to be plugged into power outlets having different power phases without having to route the power cord for the equipment to different groups or banks of outlets. Such a configuration provides for more convenient load balancing in a three-phase system. Furthermore, cable management is simplified through providing different power inputs or phases within each outlet group along the length of a PDU.

In some embodiments, the PDU 100 of this embodiment also includes a display that may provide a visual display of information related to the current being provided through each of the phases or inputs of power to the PDU 100. In some embodiments, the PDU 100 can include a network interface card (NIC) that has application firmware and hardware that interfaces to network the PDU 100 with a computer network. The PDU 100 may include outlets 115, 117, 125, that are switchable to control the application of power from the input power to a corresponding power output. The PDU 100 may also provide power state sensing and/or load-sensing with respect to the corresponding power outlets. In some embodiments, load sensing information for the different inputs and/or outlets is reported over a network through the NIC. PDUs describing these functionalities are disclosed in Applicant's U.S. Pat. No. 8,694,272, issued Apr. 8, 2014 and U.S. Pat. No. 8,305,737, issued Nov. 6, 2012.

Figure 2:
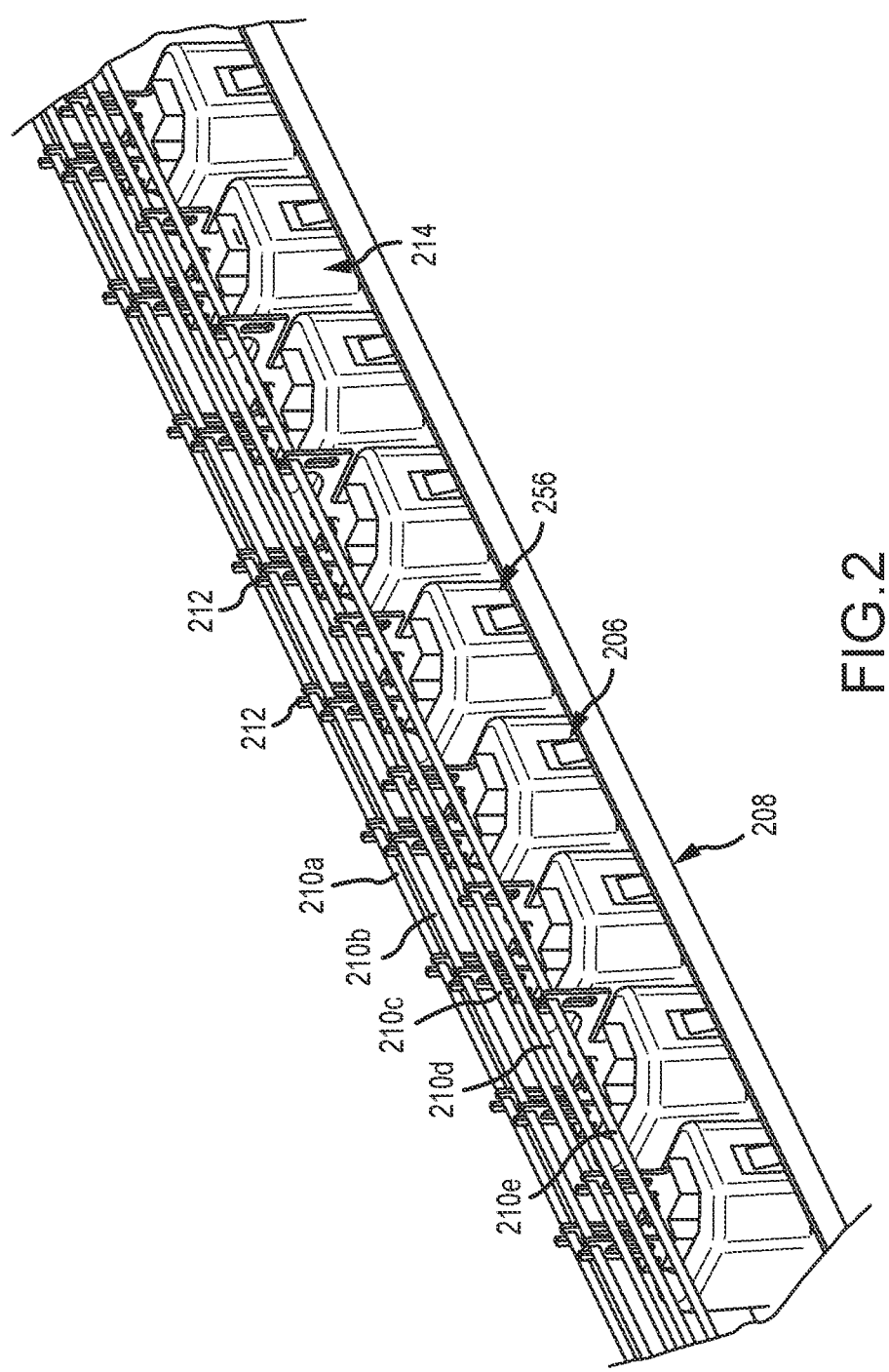
FIG. 2 shows a sectional perspective view of the PDU shown in FIG. 1 showing C13 and C19 outlets.

FIG. 2 shows a partial perspective view of the PDU shown in FIG. 1 showing C13 and C19 outlets. In FIG. 2, the back cover portion of the housing of the PDU has been removed to show the internal portion of the PDU. IEC-C19 type outlets 256 and IEC-C13 type outlets 206 are disposed on the front face 208 of the PDU 100 and are connected bus wires 210A, 210B, 210C, 210D, and 210E. In this embodiment, each outlet 206 or 256 is a "snap-in" type of outlet connected to buss wires 210A, 210*b*, 210C, 210D, and 210E that run along the length of the PDU 100. For example, 210A can be a neutral buss wire, 210B can be a ground buss wire, and 210C-210E can be line buss wires. In some embodiments, the buss wires are parallel to each other along the length of the PDU 100 as shown. Buss wires 210A, 210B, 210C, 210D, and 210E are electrically connected to outlets 206, 256 via outlet pins protruding from the outlets in a direction opposite from the front face 208. In accordance with disclosed embodiments, there can be two types of pins: a standard outlet pin and an offset outlet pin. Buss wire 210A snaps into standard outlet pin 212 to buss the neutral connections for outlets 206 which are mounted in the front face 208. Similarly, ground buss wire 210B snaps into standard outlet pin 212 to buss the ground connections for outlets 206 which are mounted in the front face 208. In other words, longitudinally adjacent ones of said ground outlet pins 212 are aligned with one another and longitudinally adjacent ones of said neutral outlet pins 212 are aligned with one another. However, the remaining three-phase buss wires are snapped into only those outlets they are intending to power (e.g., offset outlet pin 214 is connected only to buss wire 210E servicing Phase A). That is, the offset outlet pin allows for selective connection only to the outlet that the line buss is servicing. In other words, longitudinally adjacent ones of said line outlet pins are transversely spaced apart from one another such that longitudinally adjacent ones of the electrical outlets have line outlet pins receiving different line buss wires. Thus, offset outlet pins for Phase A will only allow associated outlets associated with Phase A to be connected to Phase A. Similarly, offset outlet pins for Phase B will only allow outlets associated with Phase B to be connected to Phase B. According to some embodiments, the outlet pin for Phase C has no offset. It will be understood by one skilled in the art that phase A can be any of L1, L2, or L3 in a Wye configuration, or any of X, Y, or Z in a Delta configuration, with no neutral buss wire.

As shown in FIG. 2, the IEC-C19 type outlets 256 and IEC-C13 type outlets 206 can be grouped together in an array mounted in longitudinal alignment with one another. For example, two IEC-C19 type outlets 256 are positioned next to each other with groups of IEC-C13 type outlets 206 located on either side of the IEC-C19 type outlets. Any suitable combination of outlets is possible. In some embodiments, the outlet types can alternate between IEC-C19 and IEC-C13 type outlets. In some embodiments, the outlets can comprise a unitary body, such as a molded bank of outlets.

Figure 3A:
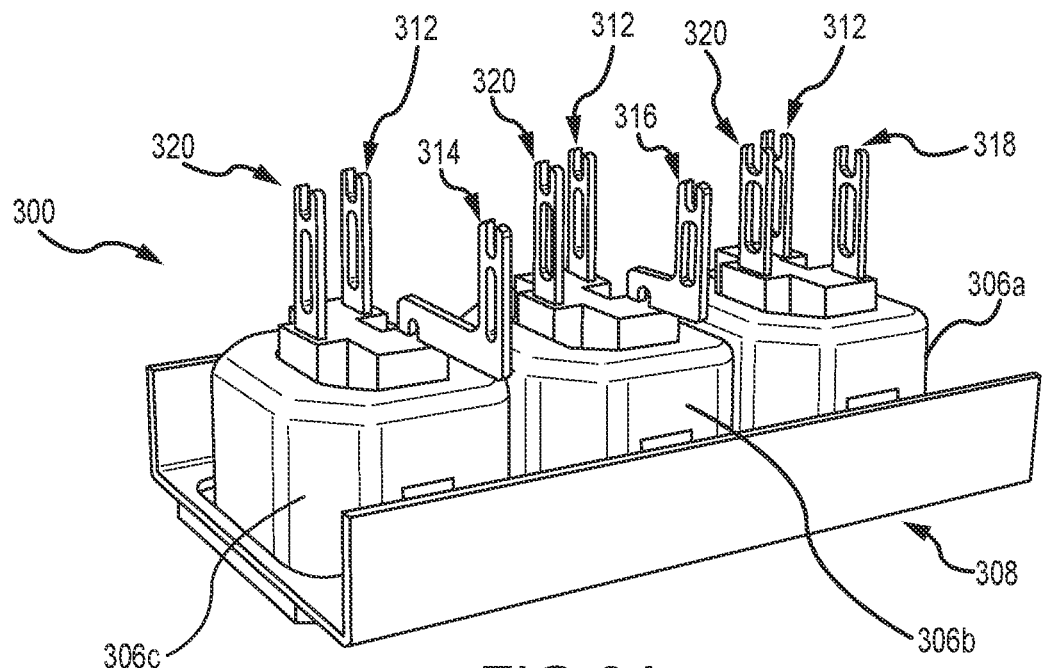
FIG. 3A is a partial perspective side view showing the outlet pin configuration of a representative number of outlets for the exemplary PDU in FIG. 2.

FIG. 3A is a partial perspective side view showing the outlet pin configuration of a representative number of outlets for the exemplary PDU in FIG. 2. In this embodiment, a sectional view of the PDU depicts IEC-C13 type receptacles 306*a*, 306*b*, and 306*c*. Outlets 306*a*, 306*b*, and 306*c* are mounted on the front face 308 of the PDU 300. Standard (e.g., straight) outlet pins 312 and 320 are connected to the respective neutral and ground buss wires. Offset outlet pin 314 connects only to the buss servicing Phase A, offset outlet pin 316 connects to the buss servicing Phase B, and standard outlet pin 318 connects to the buss servicing Phase C.

Figure 3B:
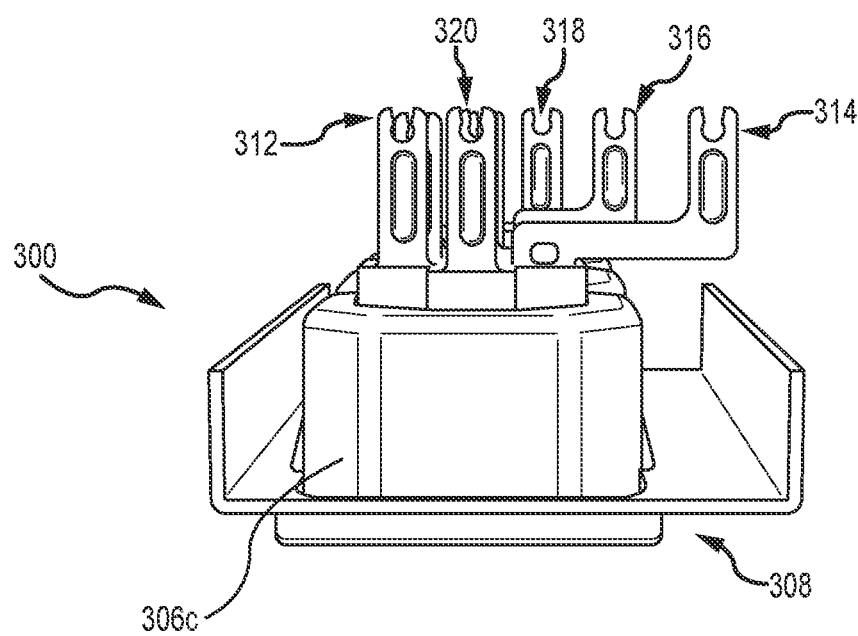
FIG. 3B is an end view of showing the outlet pin configuration of a representative outlet for the exemplary PDU in FIG. 2.

FIG. 3B is an end view of showing the outlet pin configuration of a representative outlet for the exemplary PDU in FIG. 2. Outlet 306*c* is mounted on the front face 308 of the PDU 300. FIG. 3B demonstrates the location of the offset outlet pins 316 and 314. For example, FIG. 3B shows how the offset outlet pins 316 and 314 are offset or staggered with respect to the standard outlet pins 312, 320, and 318. The outlets 306 are electrically connected within the PDU by soldering (e.g., wave soldering) the standard outlet pins 312, 320, 318 to the neutral buss wire, the ground buss wire, the buss wire servicing Phase C; and the offset outlet pins 316, 314 to buss wires servicing Phase B, Phase A. Thus, the PDU may be assembled in a relatively efficient and reliable manner. As shown in FIG. 3B, the ends (i.e., detents) of the outlet pins 312, 314, 316, 318, and 320, are vertically aligned such that when the buss wires are attached to the pins they lie in a common (e.g., horizontally oriented) plane, which facilitates wave soldering the connections. Another advantage of the disclosed connection schema featuring the standard outlet pins and the offset outlet pins is the elimination of layered PCB in favor of buss wires. This provides advantages over layered PCB construct-based embodiments that were described in Applicant's U.S. Pat. No. 9,419,416, issued Aug. 16, 2016. The presently disclosed offset pin configuration provides significant gains in terms of reducing wires, improving reliability (no hand soldering), reducing manual labor overhead, and lowering manufacturing costs of the PDU's.

Figure 4:
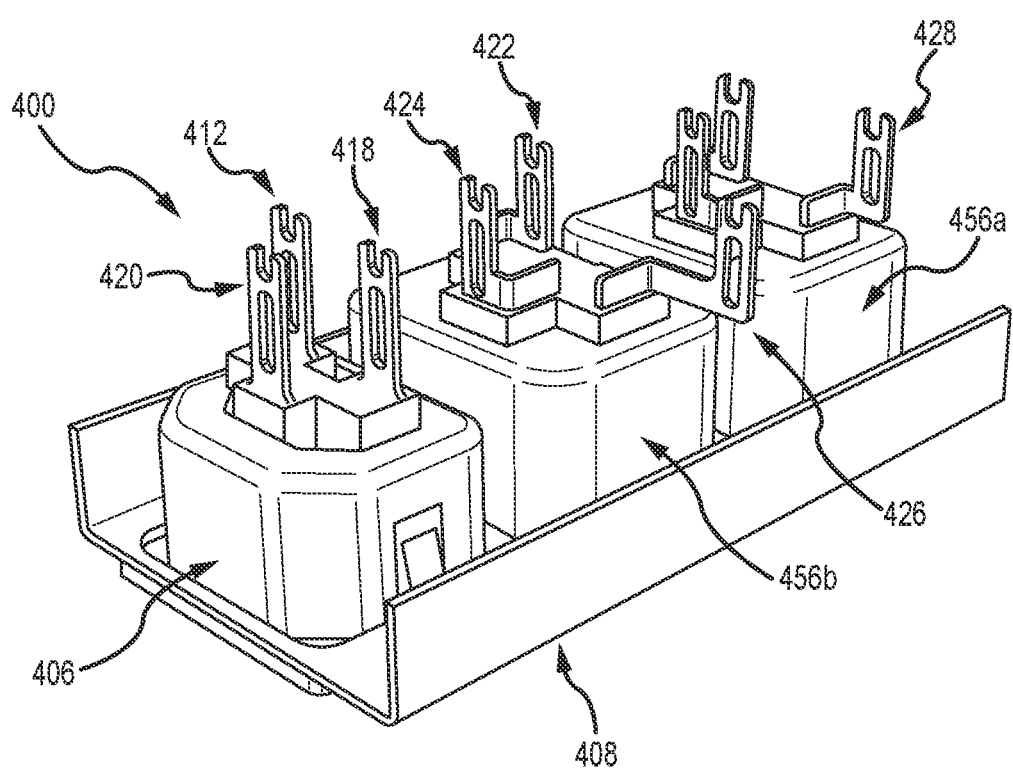
FIG. 4 is a partial perspective view of the outlet pin configuration of a PDU.

FIG. 4 is a partial perspective view of the outlet pin configuration of a PDU 400. In this embodiment, the PDU 400 includes one IEC-C13 type receptacle 406 and IEC-C19 type receptacles 456*a*, 456*b*. Outlets 406, 456*a*, 456*b* are mounted on the front face 408 of the PDU 400. Standard outlet pins 412, 420, and 418 for C13 receptacle 406 snap to the neutral buss wire, ground buss wire, and buss wire servicing Phase C. Standard outlet pin 422 for C-19 receptacle 456*b* snaps to the same neutral buss wire as the standard outlet pin 412. Standard outlet pin 424 for C19 receptacle 456*b* snaps to the ground buss wire. Offset outlet pin 428 for C19 receptacle 456*a* snaps to buss wire servicing Phase B. Offset outlet pin 426 for C19 receptacle 456*b* snaps to buss wire servicing Phase A.

Figure 5A:
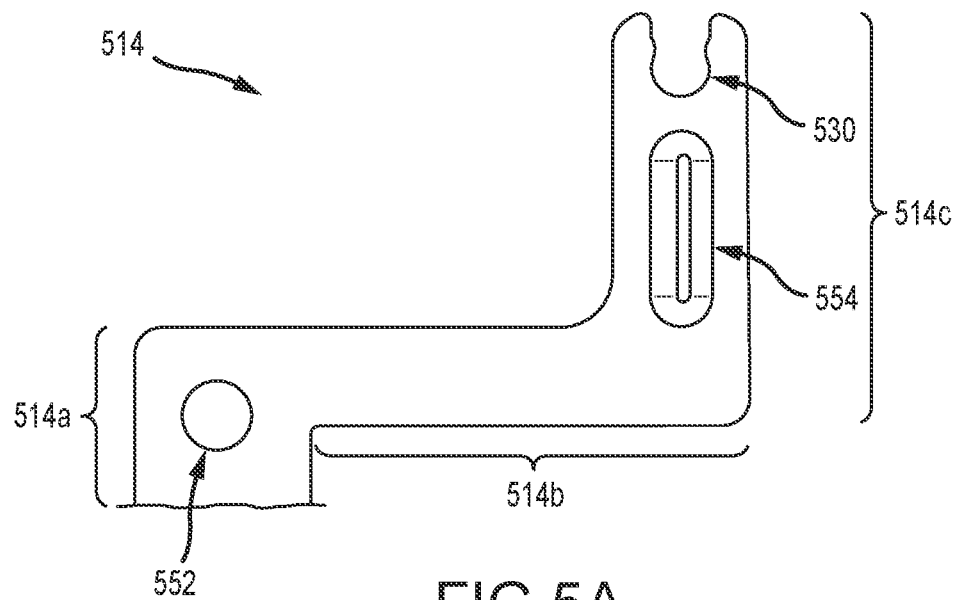
FIG. 5A and FIG. 5B are plan views of a truncated C13 offset outlet pin associated with Phase A and Phase B.
Figure 5B:
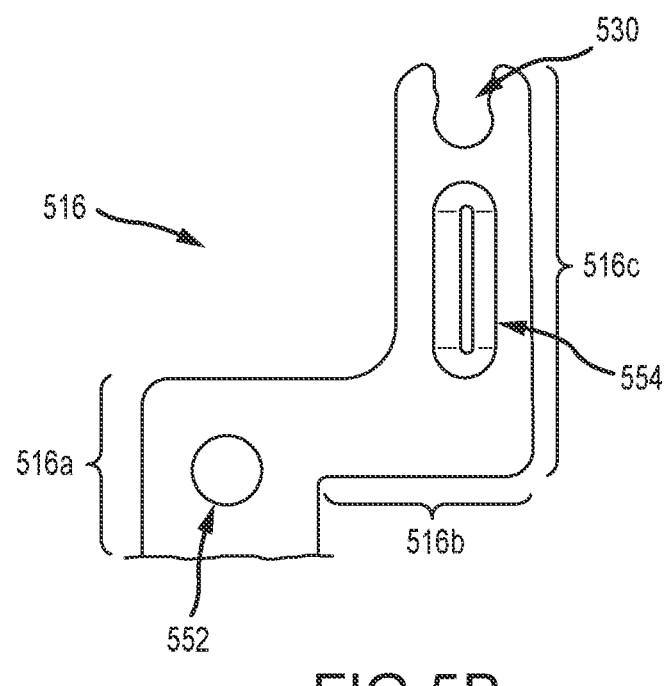

FIG. 5A and FIG. 5B are plan views of an offset outlet pin associated with Phase A and Phase B for a C13 type outlet. FIG. 5A indicates that offset outlet pin 514 includes a first vertical portion 514*a* and a second vertical portion 514*c* connected by a middle portion 514*b*. FIG. 5B indicates that offset outlet pin 516 includes a first vertical portion 516*a* and a second vertical portion 516*c* connected by a middle portion 516*b*. It should be understood that the figure is truncated where the first vertical portions 514*a* and 516*a* extend into the receptacle. The first vertical, second vertical, and middle portions can also be referred to as terminal, leg, and connector portions, respectively. The length of the middle portions 514*b*, 516*b* are different to accommodate Phase A and Phase B while maintaining electrical safety clearances between buss wires. FIG. 5A and FIG. 5B show a retention detent 530 for retaining buss wires for automated solder processes, such as wave soldering. For example, the retention detent 530 retains the buss wire in place if the assembly is turned upside down for an automatic soldering process. In some embodiments, the buss wires can be snapped into the detents 530. The detents 530 can also be referred to as clips or notches. FIG. 5A and FIG. 5B also show indents 552, 554 included in offset pins 514, 516. For example, indents 552, 554 can add strength to the construction of the pins 514, 516. The indents 552, 554 can also be referred to as ribs, stiffening ribs, or darts. Although not shown in the figures, in some embodiments, the middle portions 514b, 516b can also include stiffening ribs. The discussions in FIG. 5A and FIG. 5B are for illustrative purposes. In some embodiments, the offset outlet pin can be associated with any two phases of a three-phase supply. The length of the middle portion of the offset outlet pin will be different to accommodate the two phases to maintain electrical safety clearances between buss wires, whereas the third phase can attach to a standard pin having no middle portion (e.g., zero offset).

Figure 5C:
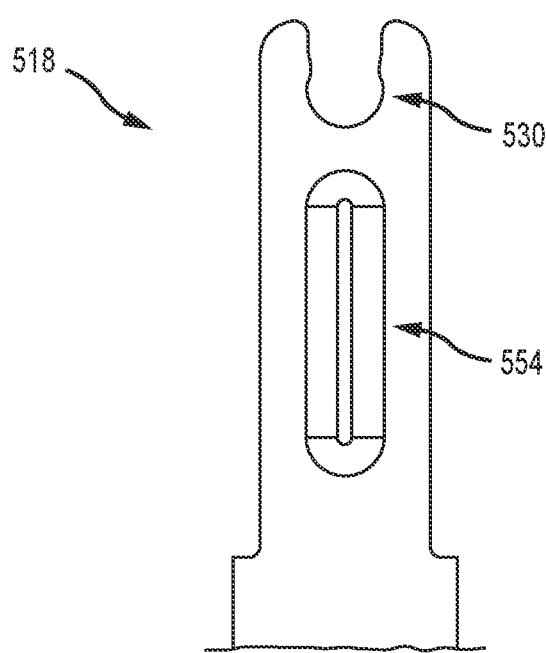
FIG. 5C is a plan view of a truncated standard outlet pin associated with Phase C.

FIG. 5C is a plan view of a standard outlet pin 518 associated with Phase C. Standard outlet pin 518 includes retention detent 530 and indent 554. Although indents have been shown with the same reference numeral in multiple drawings herein, in alternate embodiments, the indents in different pins can have different shape, form, size, or orientations. It should be understood that the figure is truncated where the outlet pin 518 extends into the receptacle.

Figure 6A:
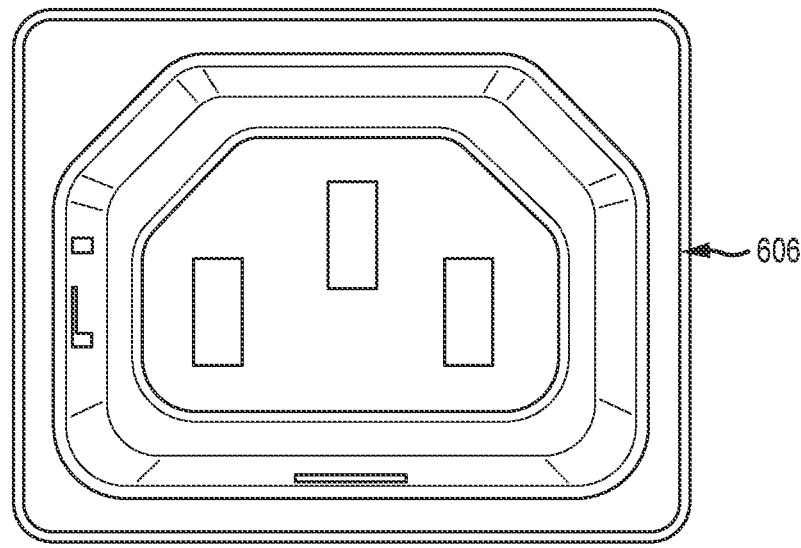
FIG. 6A and FIG. 6B show a plan view and an end view of a representative C13 outlet shown in FIG. 2.
Figure 6B:
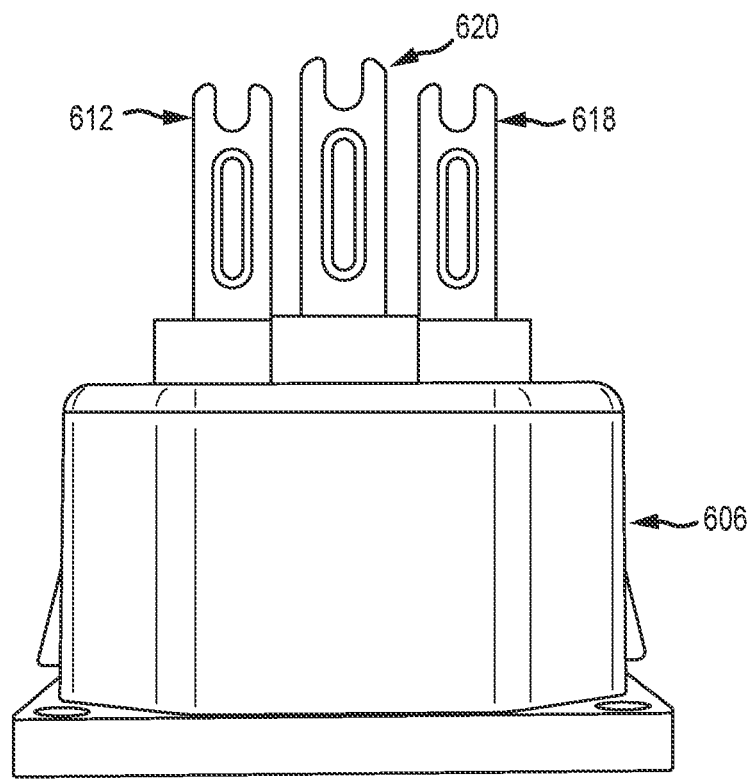

FIG. 6A and FIG. 6B show a plan view and an end view of representative IEC-C13 outlet 606. For example, outlet 606 is similar to outlet 206 shown in FIG. 2. FIG. 6B shows standard (e.g., straight) outlet pins 612, 620, and 618. Standard outlet pin 612 snaps to the neutral buss wire, standard outlet pin 620 snaps to the ground buss wire, and standard outlet pin 618 snaps to buss wire servicing Phase C. In some applications, the standard pins are commercially available pins that are customized (e.g., a detent can be formed in the end of the pin) to be compatible with the size of the buss wire.

Figure 7:
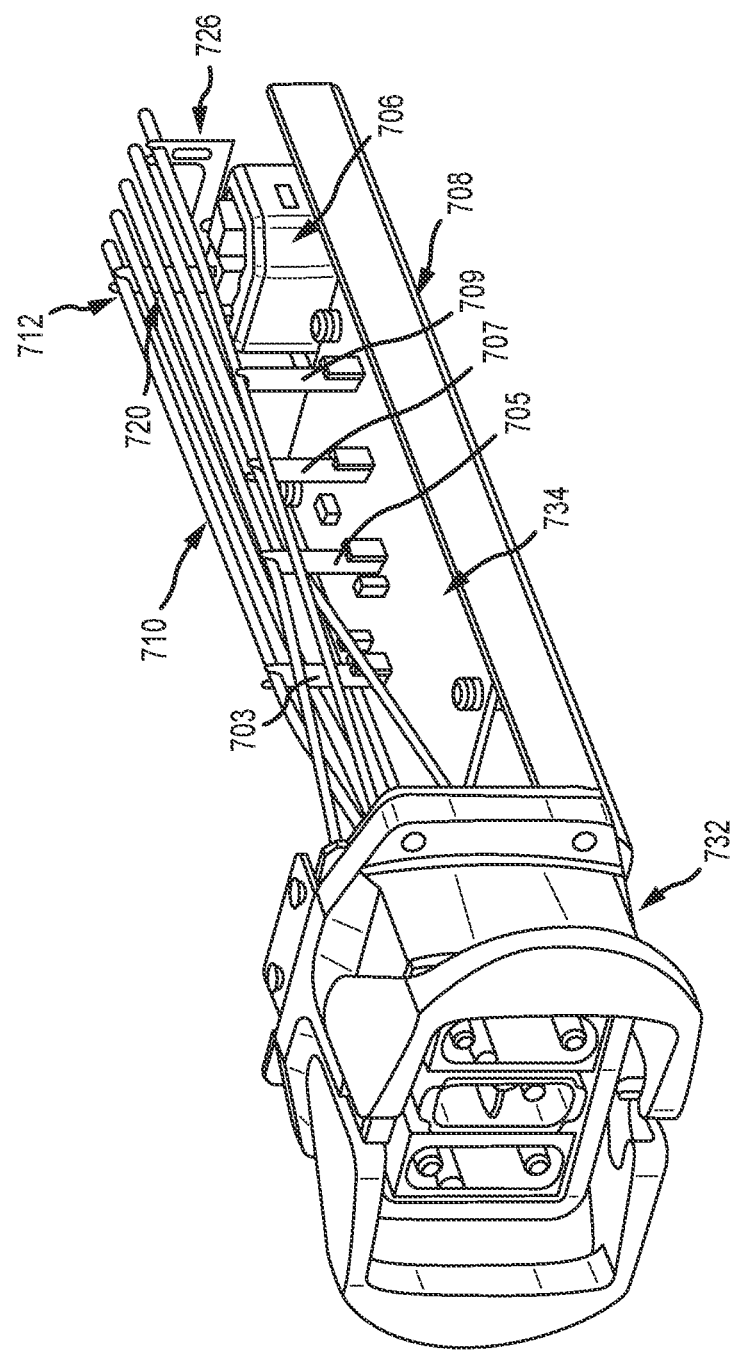
FIG. 7 shows a sectional perspective view of input power connection into the exemplary PDU in FIG. 2.

FIG. 7 shows a sectional perspective view of input power connection into the exemplary PDU in FIG. 2. Input power connector 732 connects to the buss wires 710. Input power connector 732 also supplies electrical power to power indicator board 734 and outlet 706 in the PDU. In some embodiments, the power indicator board 734 is optional and provides a visual indication when a phase is capable of delivering power to a load. For example, power indicator board 734 can include LEDs that light up when a phase voltage is present. The power indicator board 734 can include a ground pin 703 and phase pins 705, 707, and 709 to connect to the corresponding buss wires in order to sense whether power is available for each phase. Standard outlet pin 712 snaps to the neutral buss wire, standard outlet pin 720 snaps to the ground buss wire, and offset outlet pin 726 snaps to the buss wire servicing Phase A.

Figure 8A:
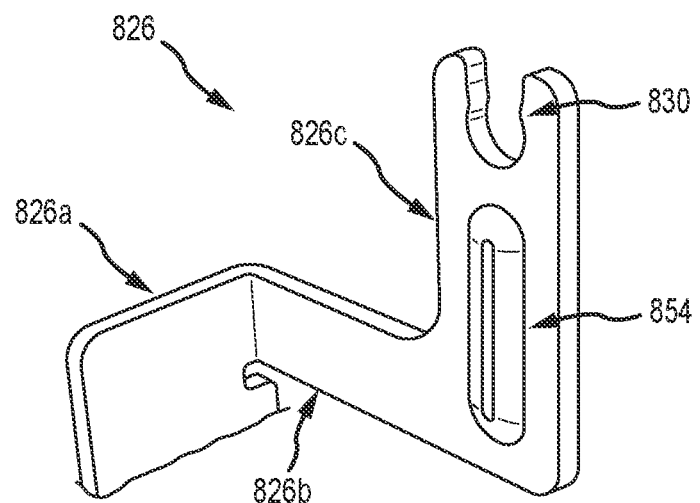
FIG. 8A and FIG. 8B are plan views of a truncated C19 offset outlet pin associated with Phase A and Phase B.
Figure 8B:
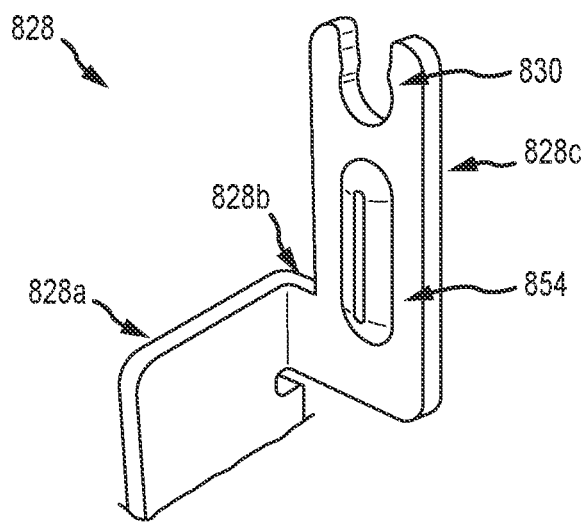

FIG. 8A and FIG. 8B are plan views of an offset outlet pin associated with Phase A and Phase B for a C19 type outlet. FIG. 8A indicates that offset outlet pin 826 includes a first vertical portion 826a perpendicular to a second vertical portion 826c connected by a middle portion 826b. FIG. 8B indicates that offset outlet pin 828 includes a first vertical portion 828a perpendicular to a second vertical portion 828c connected by a middle portion 828b. It should be understood that the figure is truncated where the first vertical portions 826a and 828a extend into the receptacle. The length of the middle portions 826b, 828b are different to accommodate Phase A and Phase B while maintaining electrical safety clearances between buss wires. FIG. 8A and FIG. 8B show a retention detent 830 for retaining buss wires for automated solder processes, such as wave soldering. For example, the retention detent 830 retains the buss wire in place if the assembly is turned upside down for an automatic soldering process. FIG. 8A and FIG. 8B also show indents 854 included in offset pins 826, 828. For example, indents 854 can add strength to the construction of the pins 826, 828. The discussions in FIG. 8A and FIG. 8B are for illustrative purposes. In alternate embodiments, the offset outlet pin can be associated with any two phases of a three-phase supply. The length of the middle portion of the offset outlet pin will be different to accommodate the two phases to maintain electrical safety clearances between buss wires. In some embodiments, as shown in FIGS. 5A, 5B, 8A, and 8B the offset outlet pins are specific to the outlet type (e.g., a C13 or a C19).

Figure 9:
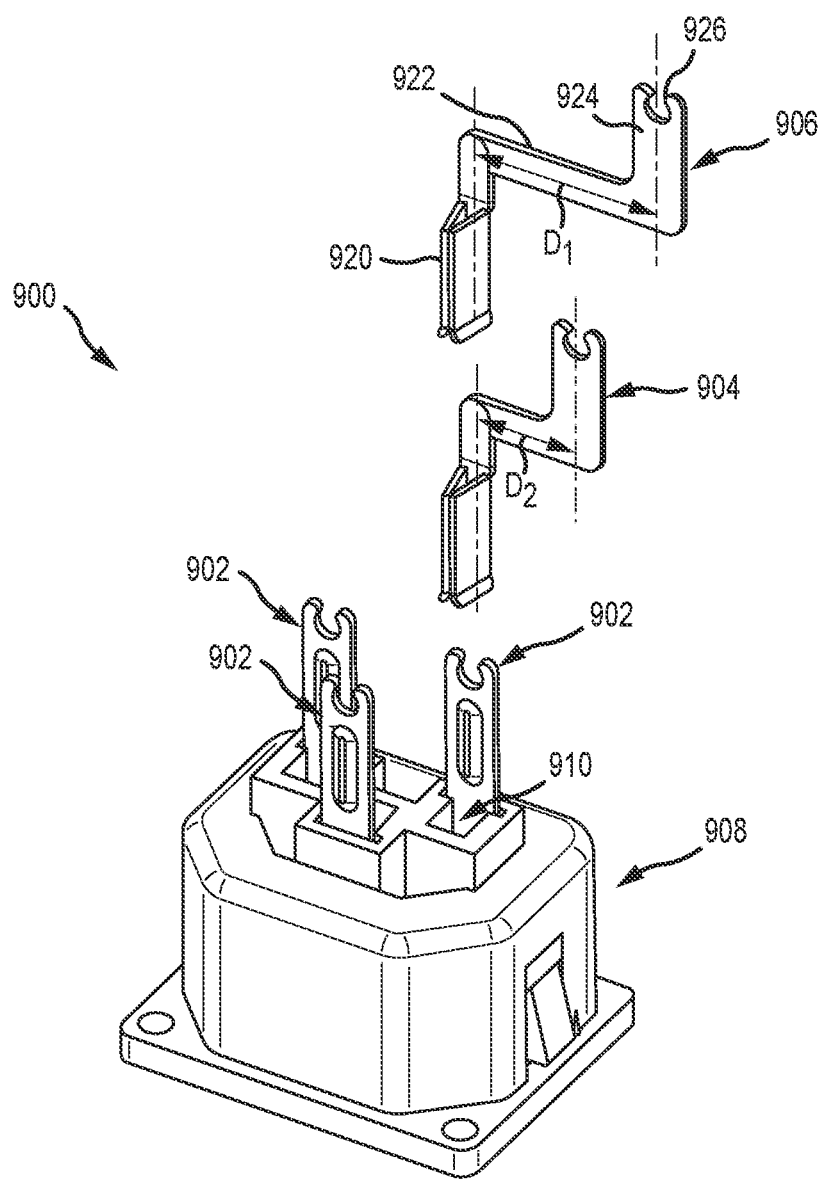
FIG. 9 is an isometric view of a C13 outlet pin kit according to a representative embodiment.

FIG. 9 illustrates a C13 outlet pin kit 900 including a receptacle 908 and multiple interchangeable outlet pins. The kit 900 can include standard or straight ground, neutral, and line pins 902. The kit 900 also includes offset outlet pins 904 and 906 that are interchangeable with one of the standard pins 902. Thus, the receptacle 908 can be configured to connect to one of three different line buss wires (e.g., 210C, 210D, or 210E; FIG. 2) by positioning the appropriate outlet pin in the receptacle opening 910. The offset outlet pins 904 and 906 include a terminal portion 920 adapted to be positioned in the receptacle opening 910 and a leg portion 922 extending laterally from the terminal portion 920. A detent 926 is carried by the leg portion 922 via a connector portion 924. The offset outlet pins 904 and 906 can be provided with various leg portion lengths, such that the detent 926 is laterally offset from the terminal portion 920 by a lateral distance, such as $D_1$ or $D_2$, for example. In some embodiments, distance $D_1$ is approximately 0.65 inches and distance $D_2$ is approximately 0.32 inches.

Figure 10:
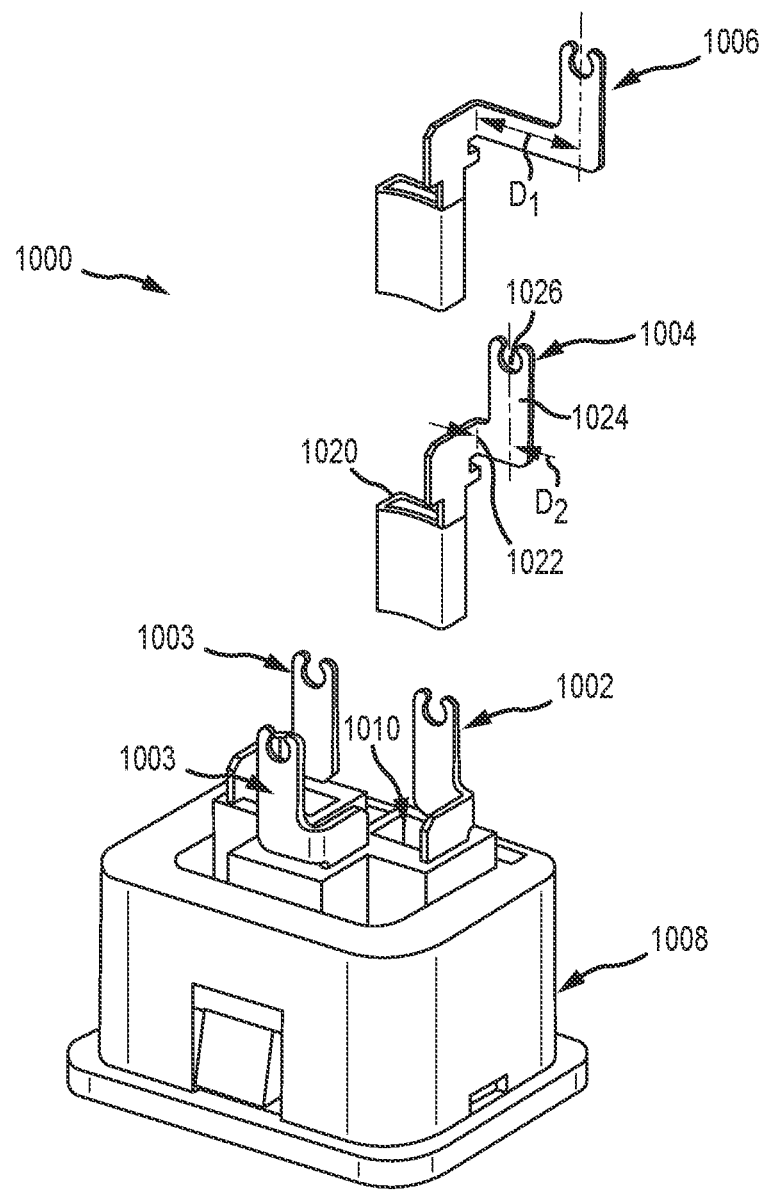
FIG. 10 is an isometric view of a C19 outlet pin kit according to a representative embodiment.

FIG. 10 illustrates a C19 outlet pin kit 1000 similar to the C13 outlet pin kit 900. Kit 1000 includes a receptacle 1008 and standard ground and neutral pins 1003. The kit 1000 also includes offset outlet pins 1002, 1004, and 1006 that are interchangeable with one another. Thus, the receptacle 1008 can be configured to connect to one of three different line buss wires (e.g., 210C, 210D, or 210E; FIG. 2) by positioning the appropriate outlet pin in the receptacle opening 1010. The offset outlet pins 1002, 1004, and 1006 include a terminal portion 1020 adapted to be positioned in the receptacle opening 1010 and a leg portion 1022 extending laterally from the terminal portion 1020. A detent 1026 is carried by the leg portion 1022 via a connector portion 1024. The offset outlet pins 1002, 1004, and 1006 can be provided with various leg portion lengths, such that the detent 1026 is laterally offset from the terminal portion 1020 by a lateral distance, such as $D_1$ or $D_2$, for example. In some embodiments, the C19 distance $D_1$ is approximately 0.48 inches and the C19 distance $D_2$ is approximately 0.16 inches. It can be appreciated in the figure that offset outlet pins 1004 and 1006 can have the same leg portion distance $D_2$; however, they extend from the terminal portion 1020 in opposite directions.

Although the discussions herein are directed for alternating phases, such discussions are for illustrative purposes only. Other embodiments may achieve alternating branch distribution or even outlet grouping (by phase) using the disclosed systems and methods. Some embodiments of the present disclosure can be applicable to bussing single phase connections.

It will be understood that this embodiment, and other embodiments described herein as having IEC-C13 and IEC-C19 type receptacles, are exemplary only and that any of various other types of receptacles alternatively can be used. For example, the "receptacles" can be other NEMA types (e.g., NEMA 5-15R, NEMA 6-20R, NEMA 6-30R or NEMA 6-50R) or any of various IEC types (e.g., IEC C19). It also will be understood that the "outlets" are not limited to three-prong receptacles; alternatively, one or more of the "outlets" can be configured for two or more than three prongs in the mating male connector. It also will be understood that the "outlets" are not limited to having female prong receptacles. Further, while the PDU of this embodiment includes fifty-four outlets, it will be understood that this is but one example and that a PDU may include a different number of outlets.

The previous description of the disclosure is provided to enable a person skilled in the art to make or use the disclosure. Various modifications to the disclosure will be readily apparent to those skilled in the art, and the generic principles defined herein may be applied to other variations without departing from the spirit or scope of the disclosure. Throughout this disclosure the term "example" or "exemplary" indicates an example or instance and does not imply or require any preference for the noted example. Thus, the disclosure is not to be limited to the examples and designs described herein but is to be accorded the widest scope consistent with the principles and novel features disclosed herein.

Remarks

The above description and drawings are illustrative and are not to be construed as limiting. Numerous specific details are described to provide a thorough understanding of the disclosure. However, in some instances, well-known details are not described in order to avoid obscuring the description. Further, various modifications may be made without deviating from the scope of the embodiments.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. It will be appreciated that the same thing can be said in more than one way. Consequently, alternative language and synonyms may be used for any one or more of the terms discussed herein, and any special significance is not to be placed upon whether or not a term is elaborated or discussed herein. Synonyms for some terms are provided. A recital of one or more synonyms does not exclude the use of other synonyms. The use of examples anywhere in this specification, including examples of any term discussed herein, is illustrative only and is not intended to further limit the scope and meaning of the disclosure or of any exemplified term.

Likewise, the disclosure is not limited to various embodiments given in this specification. Unless otherwise defined, all technical and scientific terms used herein have the same meaning as commonly understood by one of ordinary skill in the art to which this disclosure pertains. In the case of conflict, the present document, including definitions, will control.

What is claimed is:

1. A power distribution unit, comprising:
an elongate housing;
a multi-phase delta power input penetrating said housing, said multi-phase delta power input comprising at least a first phase conductor, a second phase conductor, a third phase conductor and a ground conductor; and
a plurality of electrical outlets disposed along said housing, each electrical outlet comprising:
a receptacle; and
a plurality of spaced apart outlet pins protruding from said receptacle, said plurality of outlet pins comprising:
a first line outlet pin receiving one of a first phase conductor buss wire, second phase conductor buss wire or third phase conductor buss wire,
a second line output pin receiving another one of said first phase conductor buss wire, second phase conductor buss wire or third phase conductor buss wire; and
a ground outlet pin receiving a ground buss wire; and
wherein only the ground outlet pins of longitudinally adjacent ones of said receptacles are longitudinally aligned with one another.

2. The power distribution unit of claim 1 wherein each outlet pin of each receptacle includes a detent for receiving an associated buss wire.

3. The power distribution unit of claim 1 wherein each outlet pin of each receptacle includes an associated stiffening rib.

4. The power distribution unit of claim 1 wherein longitudinally adjacent ones of said ground outlet pins are aligned with one another, and longitudinally adjacent ones of said line outlet pins are transversely spaced apart from one another.

5. The power distribution unit of claim 1 wherein at least some of said outlet pins include a first vertical portion, a second vertical portion, and a middle portion extending therebetween.

6. The power distribution unit of claim 1 wherein middle portions of longitudinally adjacent ones of the line outlet pins are of different lengths so that longitudinally adjacent ones of said line output pins are transversely offset from one another.

7. The power distribution of claim 1 wherein said plurality of electrical outlets are arranged as a plurality of modular outlet groups of like construction.

8. A power distribution unit, comprising:
an elongate housing;
a multi-phase wye power input penetrating said housing, said multi-phase wye power input comprising at least a first phase conductor, a second phase conductor, a third phase conductor, a ground conductor and a neutral conductor; and
a plurality of electrical outlets disposed along said housing, each electrical outlet comprising:
a receptacle; and
a plurality of spaced apart outlet pins protruding from said receptacle, said plurality of outlet pins comprising at least a first line outlet pin receiving an associated one of a first phase conductor buss wire, a second phase conductor buss wire or a third phase conductor buss wire,
a ground outlet pin receiving a ground buss wire; and
a neutral outlet pin receiving a neutral buss wire; and
wherein only the ground outlet pins and neutral outlet pins of longitudinally adjacent ones of said receptacles are longitudinally aligned with one another.

9. The power distribution unit of claim 8 wherein longitudinally adjacent ones of said line outlet pins are transversely spaced apart from one another.

10. The power distribution unit of claim 8 wherein at least some of said outlet pins include a first vertical portion, a second vertical portion, and a middle portion extending therebetween.

11. The power distribution unit of claim 10 wherein middle portions of longitudinally adjacent ones of the line outlet pins are of different lengths so that longitudinally adjacent ones of said line output pins are transversely offset from one another.

12. The power distribution of claim 8 wherein said plurality of electrical outlets are arranged as a plurality of modular outlet groups of like construction.

13. The power distribution unit of claim 8 wherein each outlet pin of each receptacle includes a detent for receiving an associated buss wire.

14. The power distribution unit of claim 8 wherein each outlet pin of each receptacle includes an associated stiffening rib.

15. An electrical outlet module, comprising:
a unitary body comprising:
a surrounding sidewall;
a recessed surface;
a longitudinal array of outlet receptacles projecting from said recessed surface; and
a plurality of spaced apart outlet pins protruding from a common end of each of said receptacles, said plurality of outlet pins comprising at least a first line outlet pin for receiving an associated first phase conductor buss wire, and a ground outlet pin receiving a ground buss wire; and
wherein ground outlet pins of longitudinally adjacent ones of said receptacles are longitudinally aligned with one another.

16. The electrical outlet module of claim 15 wherein each of said plurality of spaced apart outlet pins further comprises a neutral outlet pin for receiving a neutral buss wire, and wherein only ground and neutral outlet pins of longitudinally adjacent ones of said receptacles are longitudinally aligned with one another.

17. The electrical outlet module of claim 15 where each of said plurality of spaced apart outlet pins further comprises a second line output pin for receiving an associated second phase conductor buss wire, and wherein line outlet pins of longitudinally adjacent ones of said receptacles are transversely spaced apart from one another.

18. The electrical outlet module of claim 17 wherein each of said plurality of spaced apart outlet pins further comprises a neutral outlet pin for receiving a neutral buss wire, and wherein ground and neutral pins of longitudinally adjacent ones of said receptacles are longitudinally aligned with one another, while longitudinally adjacent line outlet pins are transversely spaced apart from one another.

19. The electrical outlet module of claim 15 wherein each line outlet pin includes a terminal portion positioned inside the receptacle and a leg portion extending laterally from the terminal portion to terminate beyond an outer sidewall of said receptacle.

20. The electrical outlet module of claim 15 wherein at least two of the spaced apart outlet pins associated with each receptacle are configured differently.

21. The electrical outlet module of claim 17 wherein longitudinally adjacent ones of the line outlet pins include a first vertical portion, a second vertical portion, and a middle portion extending therebetween.

22. The electrical outlet module of claim 21 wherein middle portions of longitudinally adjacent ones of the line outlet pins are of different lengths so that longitudinally adjacent ones of said line output pins are transversely offset from one another.

23. The electrical outlet module of claim 15 wherein at least one of said receptacles is an IEC-C13 type receptacle.

24. The electrical outlet module of claim 15 wherein at least one of said receptacles is an IEC-C19 type receptacle.

25. The electrical outlet module of claim 15 wherein each outlet pin of each receptacle includes an associated stiffening rib.

26. The electrical outlet module of claim 15 wherein each outlet pin of each receptacle includes a detent for receiving an associated buss wire.

* * * * *